US011659687B2

(12) United States Patent
Wan et al.

(10) Patent No.: US 11,659,687 B2
(45) Date of Patent: May 23, 2023

(54) STACK-TYPE VERTICAL HEAT DISSIPATION DEVICE

(71) Applicant: Man Zai Industrial Co., LTD., Tainan (TW)

(72) Inventors: Cheng-Chien Wan, Tainan (TW); Cheng-Jui Wan, Tainan (TW); Chun-Hsien Su, Tainan (TW); Hui-Fen Huang, Tainan (TW)

(73) Assignee: MAN ZAI INDUSTRIAL CO., LTD., Tainan (TW)

( * ) Notice: Subject to any disclaimer, the term of this patent is extended or adjusted under 35 U.S.C. 154(b) by 34 days.

(21) Appl. No.: 17/130,758

(22) Filed: Dec. 22, 2020

(65) Prior Publication Data
US 2022/0078943 A1 Mar. 10, 2022

(30) Foreign Application Priority Data
Sep. 9, 2020 (TW) .................. 109130953

(51) Int. Cl.
*H05K 7/20* (2006.01)
*F28D 15/02* (2006.01)
*F28D 15/04* (2006.01)
*F28D 21/00* (2006.01)

(52) U.S. Cl.
CPC ....... *H05K 7/20309* (2013.01); *F28D 15/025* (2013.01); *F28D 15/0266* (2013.01); *F28D 15/0275* (2013.01); *F28D 15/046* (2013.01); *H05K 7/20318* (2013.01); *F28D 2021/0031* (2013.01)

(58) Field of Classification Search
CPC ............. F28D 15/0266; F28D 15/0275; F28D 15/025; H01L 23/473
See application file for complete search history.

(56) References Cited

U.S. PATENT DOCUMENTS

| 7,093,647 | B2 * | 8/2006 | Take .................... F28D 15/04 165/104.21 |
| 2005/0161202 | A1 * | 7/2005 | Merkys .................. F25B 39/04 165/122 |
| 2007/0175610 | A1 * | 8/2007 | Yeh .................... H01L 23/473 257/E23.098 |
| 2016/0116225 | A1 * | 4/2016 | Shoujiguchi ............ F28F 3/02 29/890.035 |
| 2019/0178580 | A1 * | 6/2019 | Taras .................... B23P 15/26 |

\* cited by examiner

*Primary Examiner* — Tavia Sullens
*Assistant Examiner* — Khaled Ahmed Ali Al Samiri
(74) *Attorney, Agent, or Firm* — Muncy, Geissler, Olds & Lowe, P.C.

(57) ABSTRACT

The present invention provides a stack-type vertical heat dissipation device comprising an evaporator unit and a condenser unit. The evaporator unit has a side configured for direct or indirect contact with, and thereby receiving heat from, a high-temperature device in order for the heat to convert a heat conduction medium inside the evaporator unit into a gaseous state. The condenser unit is stacked on a top side of a housing of the evaporator unit, and is provided therein with a flow channel that is in communication with the evaporator unit and allows passage of the heat conduction medium so that the heat conduction medium is able to return to the evaporator unit under a force of gravity after condensing from the gaseous state into a liquid state and thereby complete a thermal cycle.

7 Claims, 18 Drawing Sheets

STACK-TYPE VERTICAL HEAT DISSIPATION DEVICE

BACKGROUND OF THE INVENTION

1. Technical Field

The present invention provides a heat dissipation device, in particular a stack-type vertical heat dissipation device.

2. Description of Related Art

Under normal circumstances, there is a high correlation between the performance of electronic products and temperature. The performance of electronic products decreases while the temperature increases. In practice, most of the electronic products components that tend to generate high heat are processors and chips. Generally, the operation temperature of processors and chips in the manufacturing process is approximately between 110° C. and 200° C. The operation temperature must be even higher than 230° C. in order to melt the solder during the soldering process. Accordingly, the processor or the chip will not be damaged under a certain temperature in principal.

However, many high-power devices, such as servers in data centers, must operate continuously at high power in order to achieve corresponding operation performance. The main focus of this type of devices is that the heat dissipation efficiency must be greater than the heat increasing rate. Otherwise, the temperature of the devices will increase rapidly when the heat accumulation rate is higher than the heat dissipation efficiency, which results in failure of device or power.

One major approach to maintaining the performance of a high-power electronic device is to lower the ambient temperature through an air conditioning device. A more direct, and hence more effective, alternative is to install a heat dissipation device where high heat is generated, the objective being to enhance the heat dissipation efficiency of an electronic device through the highly efficient exchange of heat between the electronic device and the heat transfer medium of the heat dissipation device, thereby controlling the temperature of the electronic device within an acceptable range. When it comes to the servers in a data center, however, the electronic devices involved are subject to not only requirements in heat dissipation efficiency, but also requirements in volume, size, and dimensions due to the limitations on space allocation. It is therefore important to find ways to achieve optimal heat dissipation efficiency in a limited space and meet manufacturers' requirements as well, and this is obviously an issue in the related industries that needs to be addressed persistently.

BRIEF SUMMARY OF THE INVENTION

The primary objective of the present invention is to provide a stack-type vertical heat dissipation device comprising an evaporator unit and a condenser unit. The evaporator unit has a side configured for direct or indirect contact with, and thereby receives heat from, a high-temperature device in order for the heat to convert a heat conduction medium inside the evaporator unit into a gaseous state. The condenser unit is stacked on a top side of the evaporator unit, and is provided therein with a flow channel that is in communication with the evaporator unit and allows passage of the heat conduction medium so that the heat conduction medium is able to return to the evaporator unit under a force of gravity after condensing from the gaseous state into a liquid state and thereby complete a thermal cycle.

Furthermore, the evaporator unit includes a housing, an evaporation chamber provided inside the housing, and a skived structure provided in the evaporation chamber; the condenser unit includes an upper main duct, a lower main duct, a plurality of flat tubes each having two opposite ends coupled to and communicating with the upper main duct and the lower main duct respectively, and at least one main gas-flow passage tube that is coupled between and in communication with the upper main duct and the evaporation chamber; and a plurality of heat dissipation fins are provided around the flat tubes.

Furthermore, the main gas-flow passage tube has a lower-end opening corresponding in position to the skived structure, a main body extending through a middle portion of the lower main duct, and an upper-end opening in communication with the upper main duct.

Furthermore, one or more drainage tubes are provided between the lower main duct and the evaporator unit, and each drainage tube has an upper-end opening in communication with an inner bottom side of the lower main duct and a lower-end opening in communication with an internal chamber of the evaporator unit.

Furthermore, each flat tube is integrally formed therein with a plurality of partition walls that divide the interior of the flat tube into a plurality of capillary tubes.

Furthermore, each capillary tube has a width of 0.5 mm to 2 mm and a height of 0.5 mm to 4 mm.

Furthermore, the upper main duct, the lower main duct, and the main gas-flow passage tube are arranged side by side and are plural.

Furthermore, the numbers of the upper main duct, the lower main duct, and the main gas-flow passage tube are one to four, respectively.

Furthermore, a reinforcing connection plate is provided between the adjacent upper main ducts, the reinforcing connection plate has one or more communication holes, and the openings at two opposite ends of each communication hole are in communication with the upper main ducts at the two opposite ends of the communication hole respectively.

Furthermore, a reinforcing connection plate is provided between the adjacent lower main ducts, the reinforcing connection plate has one or more communication holes, and the openings at two opposite ends of each communication hole are in communication with the lower main ducts at the two opposite ends of the communication hole respectively.

Furthermore, the evaporator unit includes a first housing, an evaporation chamber provided inside the first housing, and a skived structure provided in the evaporation chamber; and the condenser unit includes a plurality of flat tubes coupled to a top side of the first housing at one end, a second housing provided at top-side ends of the flat tubes, and a plurality of heat dissipation fins provided around the flat tubes; wherein the second housing is provided therein with a condensation chamber that is in communication with the evaporation chamber through the flat tubes, and the heat conduction medium is introduced in an overfilling manner into the evaporation chamber, the flat tubes, and the condensation chamber.

Furthermore, the skived structure includes a plurality of skived plates, and the distance between each two adjacent skived plates ranges from 0.1 mm to 0.5 mm.

Furthermore, the heat dissipation fins are formed by rolling or are plate-based fins.

Furthermore, each plate-based fin includes a plate-shaped body and one or a plurality of connection portions that are provided on the plate-shaped body to increase the height of the plate-shaped body, and each connection portion has a through hole to be penetrated by the corresponding flat tube, with the outer periphery of the corresponding flat tube tightly enclosed by the wall of the through hole.

Furthermore, each connection portion has a height of 0.5 mm to 3 mm.

Furthermore, each flat tube is integrally formed therein with a plurality of partition walls that divide the interior of the flat tube into a plurality of capillary tubes.

Furthermore, each capillary tube has a width of 0.5 mm to 2 mm and a height of 0.5 mm to 4 mm.

Furthermore, the first housing directly or indirectly contacts a surface of the high-temperature device, wherein the surface of the high-temperature device is provided on a bottom side of the first housing and corresponds to an opposite side of the skived structure.

Furthermore, the evaporator unit includes a housing, an evaporation chamber provided inside the housing, and a skived structure provided in the evaporation chamber; the condenser unit includes a plurality of flat tubes coupled to a top side of the housing and a plurality of heat dissipation fins stacked on the housing and provided around the flat tubes, and each flat tube is U-shaped such that the openings on two opposite lateral sides of each flat tube are connected to the top side of the housing, are in communication with the evaporation chamber inside the housing, and correspond to a position above the skived structure; and the heat conduction medium is introduced in an overfilling manner into the evaporation chamber and the flat tubes, the two of which are in communication with each other.

Furthermore, the skived structure includes a plurality of skived plates, and the distance between each two adjacent skived plates ranges from 0.1 mm to 0.5 mm.

Furthermore, each heat dissipation fin has an inverted square U-shaped cross section, and the heat dissipation fins are sequentially fastened together, with a tail end of one fin connected to a head end of the next.

Furthermore, the distance between each two adjacent ones of the inverted square U-shaped and sequentially fastened fins is 0.5 mm to 3 mm.

Furthermore, each flat tube is integrally formed therein with a plurality of partition walls that divide the interior of the flat tube into a plurality of capillary tubes.

Furthermore, each capillary tube has a width of 0.5 mm to 2 mm and a height of 0.5 mm to 4 mm.

Furthermore, the housing directly or indirectly contacts a surface of the high-temperature device, wherein the surface of the high-temperature device is provided on a bottom side of the housing and corresponds to an opposite side of the skived structure.

Comparing to the conventional techniques, the present invention has the following advantages:

1. The present invention provides higher heat dissipation efficiency than the prior art and allows the end product to be effectively downsized for higher practicality.

2. The structure of the present invention can effectively withstand the pressure generated by being overfilled with a heat conduction medium, so the safety and service life of the end product are increased in comparison with those of the prior art.

3. By way of vertical stacking, the present invention effectively enhances the circulation efficiency of the heat conduction medium and thereby reduces clogging when the heat conduction medium cools down.

DETAILED DESCRIPTION OF THE INVENTION

The details and technical solution of the present invention are hereunder described with reference to accompanying drawings. For illustrative sake, the accompanying drawings are not drawn to scale. The accompanying drawings and the scale thereof are not restrictive of the present invention.

Figure 1:
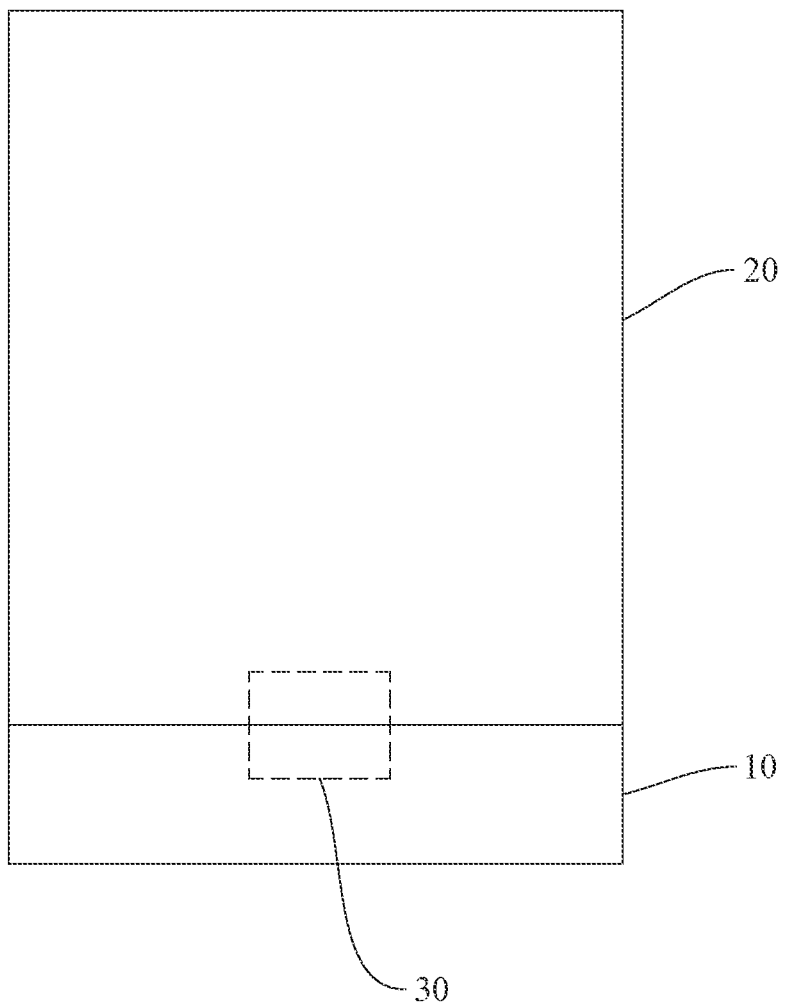
FIG. 1 is a diagram of the basic structure of the stack-type vertical heat dissipation device of the present invention.

The basic structure of the stack-type vertical heat dissipation device 100 of the present invention is described below with reference to FIG. 1, which schematically shows the basic structure of the stack-type vertical heat dissipation device of the invention.

The stack-type vertical heat dissipation device 100 disclosed herein essentially includes an evaporator unit 10 and a condenser unit 20 stacked on the top side of the housing of the evaporator unit 10.

One side of the evaporator unit 10 is configured for direct or indirect contact with a high-temperature device and thereby receiving the heat of the high-temperature device, in order for the heat to convert the heat conduction medium inside the evaporator unit 10 into the gaseous state. The evaporator unit 10 in the present invention may be any evaporator with an evaporation chamber, such as a skived evaporator or other similar evaporators; the invention has no limitation in this regard.

The condenser unit 20 is provided therein with a flow channel 30 that is in communication with the evaporator unit 10 and allows passage of the heat conduction medium. Once the gaseous heat conduction medium condenses into the liquid state, the liquid heat conduction medium can return to the evaporator unit 10 through the flow channel 30 under the force of gravity to complete a thermal cycle. The condenser unit 20 in the present invention may be an air-cooled condenser or other similar condensers without limitation.

The evaporator unit 10 is located in a lower portion of the stack-type vertical heat dissipation device 100 of the present invention in order to collect the liquid heat conduction medium. The heat transfer structure (e.g., fins or a skived structure) in the evaporator unit 10 receives the heat of the high-temperature device and transfers the heat to the liquid heat conduction medium, which undergoes a change in phase, i.e., evaporates into the gaseous state, after receiving the heat. With a relatively low density, the gaseous heat conduction medium moves upward through the flow channel 30 into the tubes of the condenser unit 20.

Once the gaseous heat conduction medium enters the condenser unit 20, heat exchange takes place between the gaseous heat conduction medium and the heat exchange structure in the condenser unit 20; as a result, the gaseous heat conduction medium is cooled and condenses into the liquid state. The liquid heat conduction medium returns to the evaporator unit 10 through the flow channel 30 between the evaporator unit 10 and the condenser unit 20 and thereby completes the thermal cycle. In one embodiment, the flow channel through which the gaseous heat conduction medium flows from the evaporator unit 10 to the condenser unit 20 may or may not be the same flow channel through which the liquid heat conduction medium returns from the condenser unit 20 to the evaporator unit 10; the present invention has no limitation in this regard. The two cases will be demonstrated below by two different embodiments respectively.

Figure 2:
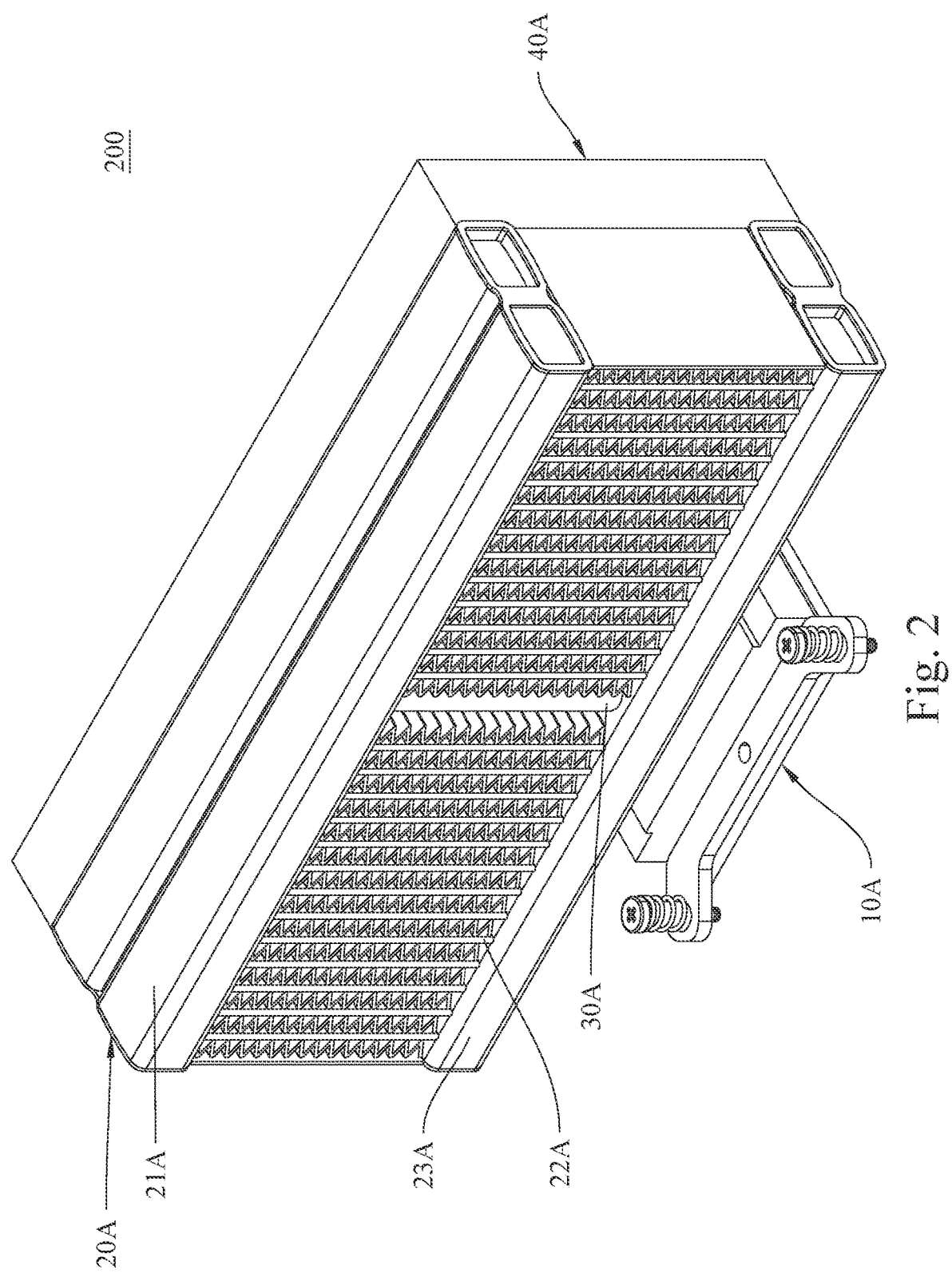
FIG. 2 is a perspective view of the first embodiment of the present invention.
Figure 3:
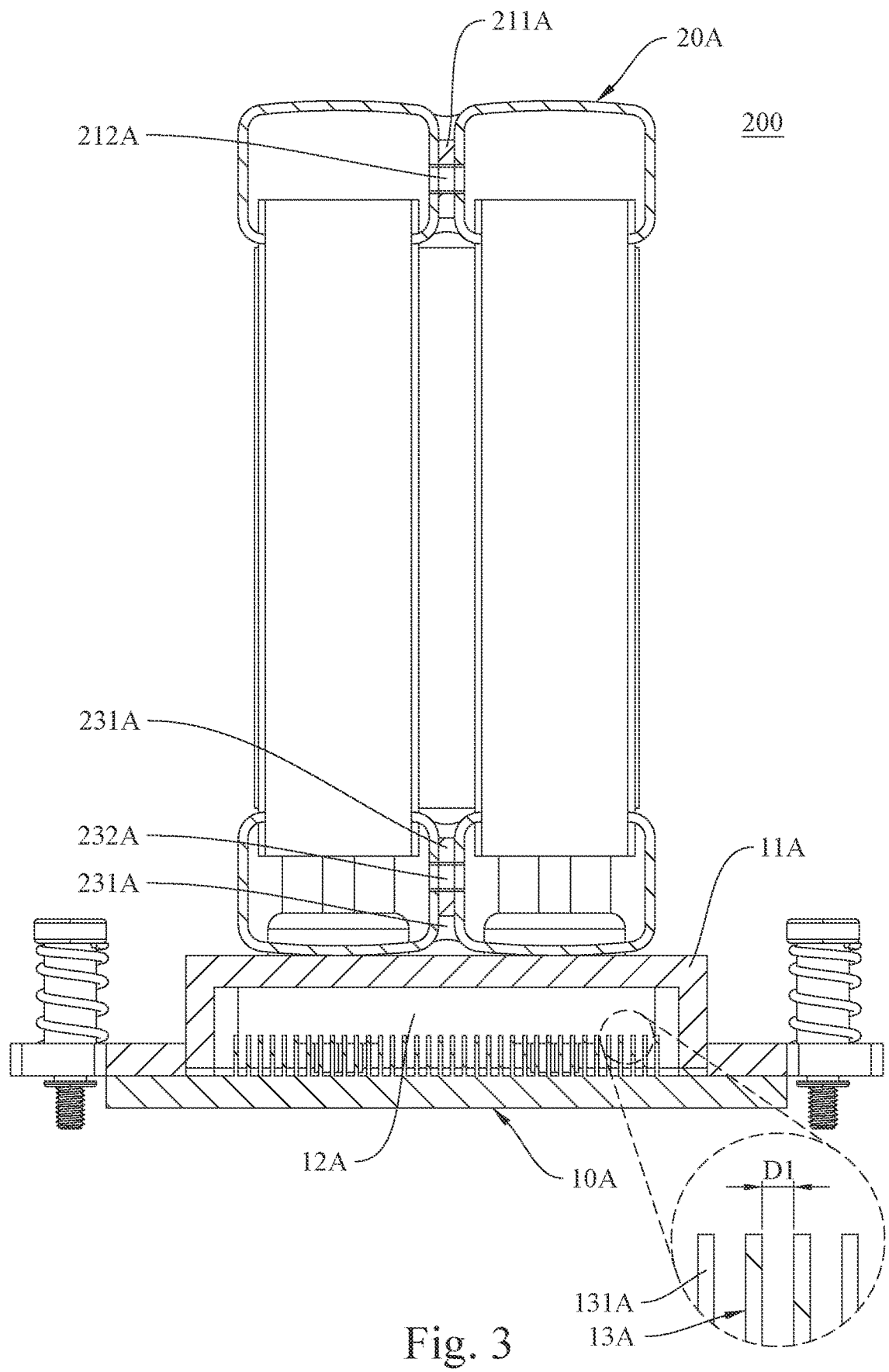
FIG. 3 is a sectional view and a partial enlarged view of the first embodiment of the present invention.
Figure 4:
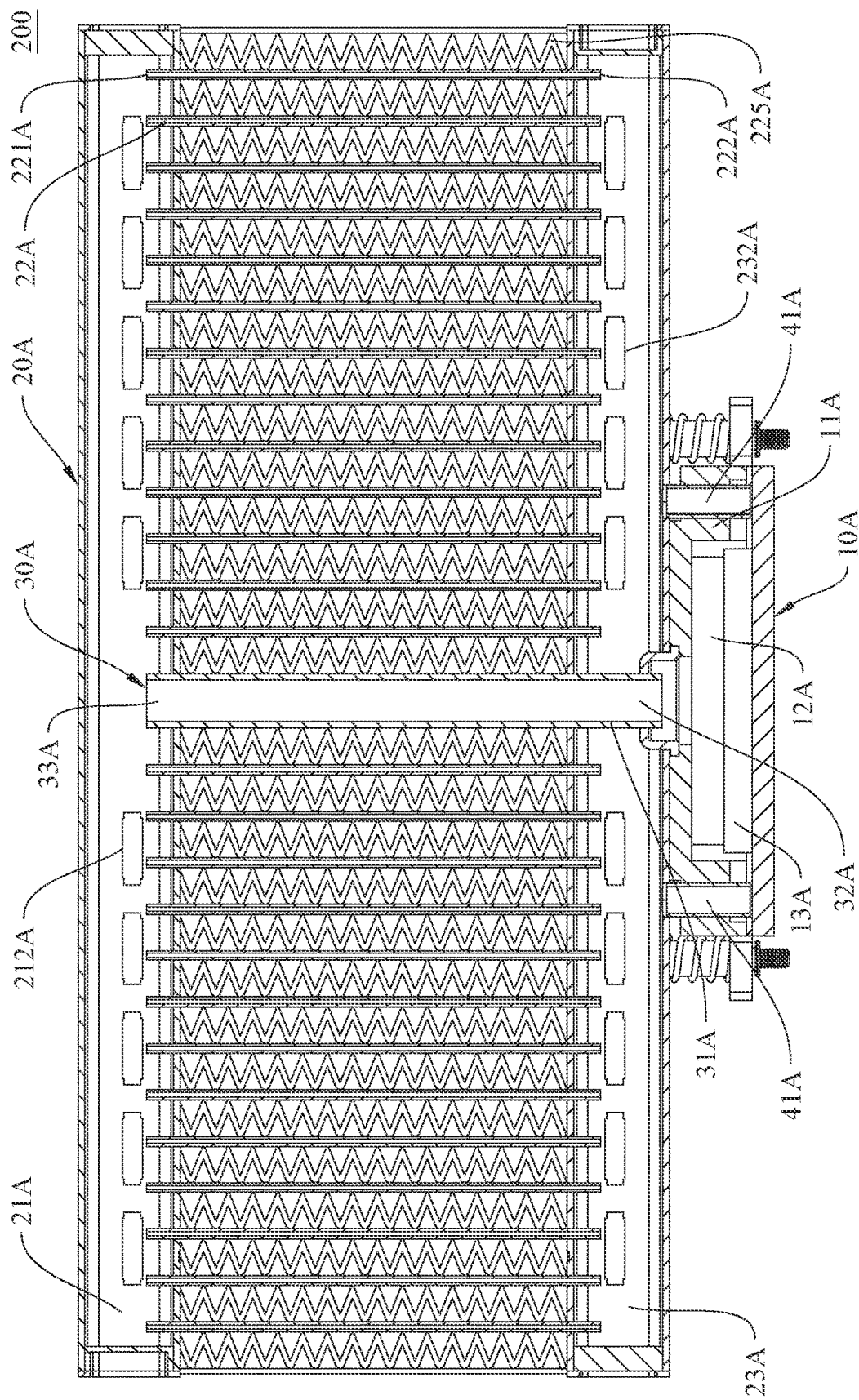
FIG. 4 is a sectional view of the first embodiment of the present invention.

The following paragraphs describe an embodiment of the present invention with reference to FIG. 2, FIG. 3, and FIG. 4, which show a perspective view, a sectional view, a partial enlarged view, and another sectional view of the first embodiment of the invention.

The stack-type vertical heat dissipation device 200 according to the first embodiment essentially includes an evaporator unit 10A, a condenser unit 20A coupled to the top side of the evaporator unit 10A, and a fan unit 40A provided on one side of the condenser unit 20A.

The evaporator unit 10A essentially includes a housing 11A, an evaporation chamber 12A provided inside the housing 11A, and a skived structure 13A provided in the evaporation chamber 12A. In one preferred embodiment, the housing 11A may be made of aluminum, an aluminum alloy, or other similar materials; the present invention has no limitation in this regard.

The skived structure 13A includes a plurality of skived plates 131A that are formed on the inner bottom side of the housing 11A by skiving. In one feasible embodiment, the distance D1 between each two adjacent skived plates 131A may range from 0.1 mm to 0.5 mm (see FIG. 3), which numerical range can lead to highly efficient heat dissipation.

The condenser unit 20A, which is provided on the top side of the housing 11A, includes an upper main duct 21A, a lower main duct 23A, a plurality of flat tubes 22A each having two opposite ends coupled to and communicating with the upper main duct 21A and the lower main duct 23A respectively, and at least one main gas-flow passage tube 30A that is coupled between and in communication with the upper main duct 21A and the evaporation chamber 12A of the evaporator unit 10A. The lower-end opening 32A of the main gas-flow passage tube 30A corresponds in position to the skived structure 13A in the evaporator unit 10A. The main body 31A of the main gas-flow passage tube 30A extends through a middle portion of the lower main duct 23A. The upper-end opening 33A of the main gas-flow passage tube 30A is in communication with the upper main duct 21A. For airtight purposes, the peripheral wall of each of the lower-end opening 32A and the upper-end opening 33A of the main gas-flow passage tube 30A may be fixedly soldered to the corresponding aperture of the evaporator unit 10A and/or of the upper main duct 21A. In another feasible embodiment, airtightness can be achieved with the provision of O-rings, and the present invention has no limitation on how airtightness is achieved.

The flat tubes 22A are provided between the upper main duct 21A and the lower main duct 23A, and the present invention has no limitation on the number of the flat tubes 22A, provided that the number is properly designed and takes into account the overfill amount of the heat conduction medium, the capacities of the upper main duct 21A and of the lower main duct 23A, and the target heat exchange efficiency. Each flat tube 22A has a first opening 221A at one end and a second opening 222A at the other end, wherein the first opening 221A is in communication with the upper main duct 21A and the second opening 222A is in communication with the lower main duct 23A. For airtight purposes, the peripheral wall of each of the first opening 221A and the second opening 222A of each flat tube 22A may be fixedly soldered to the corresponding flat tube-receiving aperture of the upper main duct 21A or of the lower main duct 23A. In another feasible embodiment, airtightness can be achieved with the provision of O-rings, and the present invention has no limitation on how airtightness is achieved.

Figure 5:
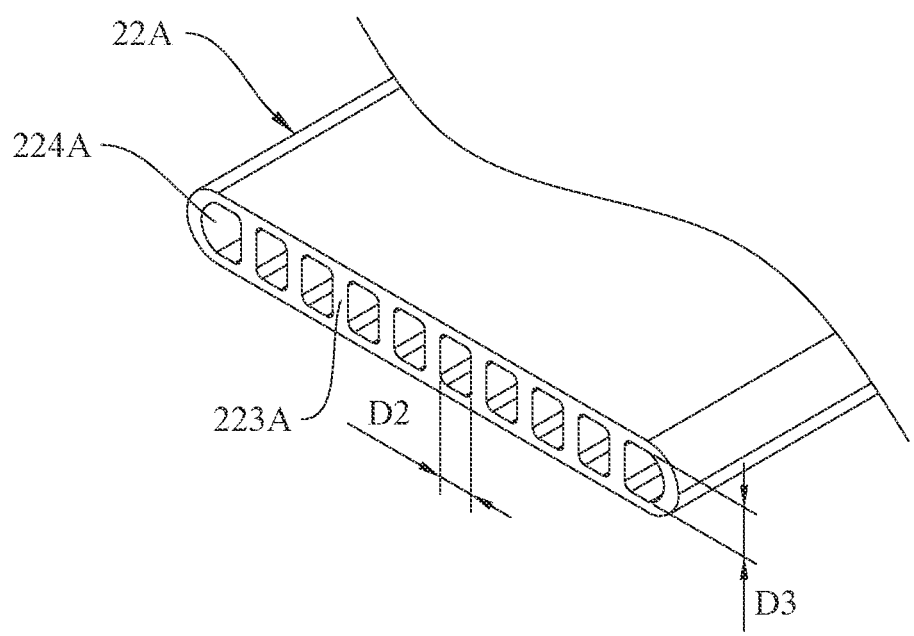
FIG. 5 is a partial enlarged view of a flat tube and the capillary tubes therein of the first embodiment of the present invention.

Please refer to FIG. 5 for a partial enlarged view of a flat tube, and the capillary tubes therein, in the first embodiment of the present invention.

In order to provide better heat dissipation and increase the mechanical stability of the flat tubes 22A against pressure, each flat tube 22A is provided therein, or more particularly is integrally formed therein, with a plurality of partition walls 223A that divide the interior of the flat tube 22A into a plurality of capillary tubes 224A. The partition walls 223A in each flat tube 22A help reinforce the central portions of the two flat sides of the flat tube 22A, thereby addressing the problem of insufficient pressure tolerance of those central portions and reducing the chance of tube bursting. In one feasible embodiment, the flat tubes 22A may be aluminum extruded tubes so that heat can be rapidly carried away by virtue of the structural design of the plural capillary tubes and the increased contact area provided by the capillary tubes. As the aluminum extrusion design allows the heat exchange area to be significantly enlarged, the uniformity of heat distribution as well as the amount of the heat carried away can be effectively increased, making it possible to distribute heat more evenly over the heat dissipation fins 225A (as described further below) so that heat can be rapidly diffused from a concentrated heat source (e.g., a chip) and then dissipated over a large area through the fan unit 40A. In one feasible embodiment, the width D2 of each capillary tube 224A is 0.5 mm to 2 mm, and the height D3 of each capillary tube 224A is 0.5 mm to 4 mm. Both pressure tolerance and heat dissipation efficiency should be considered when determining the width D2 and height D3 of the capillary tubes 224A; for example, overly small capillary tubes 224A will hinder circulation of the heat conduction medium. To enhance the heat dissipation effect of the flat tubes 22A, one preferred embodiment includes a plurality of heat dissipation fins 225A inserted respectively into the gaps between the flat tubes 22A to increase the heat dissipation area and hence heat dissipation efficiency. In one embodiment, the heat dissipation fins 225A may be, for example, plates in a wound configuration, series-connected plates, soldered plates, rolled plates, or plates that are fastened together; the present invention has no limitation in this regard.

In order to allow passage of the liquid heat conduction medium from the lower main duct 23A to the evaporation chamber 12A inside the evaporator unit 10A, one or more drainage tubes 41A are provided between the lower main duct 23A and the evaporator unit 10A. The upper-end opening 41B of each drainage tube 41A is in communication with the inner bottom side of the lower main duct 23A while the lower-end opening 41C of each drainage tube 41A is in communication with the evaporation chamber 12A of the evaporator unit 10A. The liquid heat conduction medium, therefore, can flow back into the evaporation chamber 12A through the drainage tubes 41A under the force of gravity.

To achieve higher heat exchange efficiency, a single-array configuration composed of a single upper main duct 21A, a single lower main duct 23A, a single main gas-flow passage tube 30A, and a single row of flat tubes 22A provided between the upper main duct 21A and the lower main duct 23A can be expanded into a plurality of juxtaposed arrays in which a plurality of upper main ducts 21A, a plurality of lower main ducts 23A, and a plurality of main gas-flow passage tubes 30A are arranged in a side-by-side manner. In the embodiment shown in FIG. 2 to FIG. 4, there are two upper main ducts 21A, two lower main ducts 23A, and two main gas-flow passage tubes 30A that jointly form two juxtaposed arrays. To increase the structural tightness between the adjacent main ducts (e.g., the upper main ducts 21A or the lower main ducts 23A), a reinforcing connection plate 211A is provided between the adjacent upper main ducts 21A. The reinforcing connection plate 211A has one or more communication holes 212A, and the openings at the two opposite ends of each communication hole 212A are in communication with the internal chambers of the upper main ducts 21A at the two opposite ends of the communication hole 212A respectively. Similarly, a reinforcing connection plate 231A is provided between the adjacent lower main ducts 23A, the reinforcing connection plate 231A has one or more communication holes 232A, and the openings at the two opposite ends of each communication hole 232A are in communication with the internal chambers of the lower main ducts 23A at the two opposite ends of the communication hole 232A respectively. Thus, the gaseous/liquid heat conduction medium can flow between the adjacent upper main ducts 21A or the adjacent lower main ducts 23A to balance the pressure in the adjacent duct chambers and the heat dissipation efficiency of the adjacent main ducts.

Figure 6:
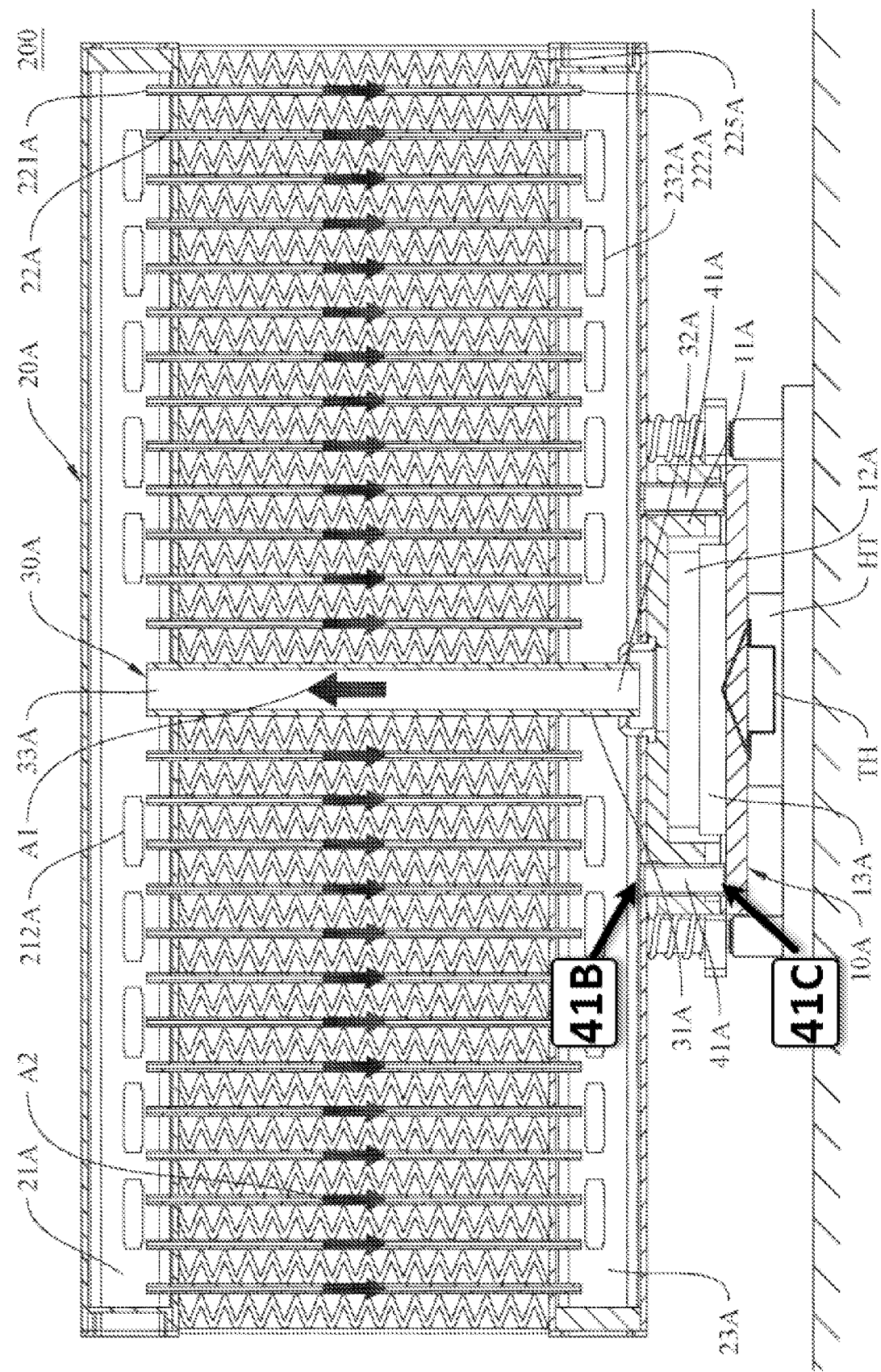
FIG. 6 is a diagram of the heat conduction path of the first embodiment of the present invention.

As to the heat conduction path of the stack-type vertical heat dissipation device 200 of the present invention, please refer to FIG. 6 for the heat conduction path of the first embodiment of the invention.

While the stack-type vertical heat dissipation device 200 is in operation, the heat of the high-temperature device HT is diffused radially from under the housing 11A of the evaporator unit 10A to the skived structure 13A on the inner bottom side of the housing 11A (as indicated by the arrow TH), and the temperature of the skived structure 13A rises as a result. In the meantime, the heat conduction medium in which the skived structure 13A is immersed absorbs the heat of the skived structure 13A, undergoes a change in phase (i.e., is converted into the gaseous state), and ascends through the main gas-flow passage tubes 30A to the internal chambers of the upper main ducts 21A (as indicated by the arrow A1). As the heat conduction medium is added in an overfilling manner, the gaseous heat conduction medium at the back end will push the gaseous heat conduction medium at the front end into the flat tubes 22A. The gaseous heat conduction medium in the flat tubes 22A exchanges heat with the heat dissipation fins 225A through the tube walls of the flat tubes 22A and gradually condenses into the liquid state. The liquid heat conduction medium then flows to the internal chambers of the lower main ducts 23A under the force of gravity (as indicated by the arrow A2). It is worth mentioning that the liquid heat conduction medium moving through the flat tubes 22A not only is drawn downward by the force of gravity, but also draws the liquid heat conduction medium at the back end through a siphonic action to increase the flow velocity. The liquid heat conduction medium flowing into the lower main ducts 23A passes through the drainage tubes 41A at the bottom side of the internal chambers of the lower main ducts 23A and flows into the evaporation chamber 12A of the evaporator unit 10A. The liquid heat conduction medium in the evaporation chamber 12A is reheated by the skived structure 13A and turns into the gaseous state again, thereby completing a thermal cycle, or a cycle of phase changes.

Figure 7:
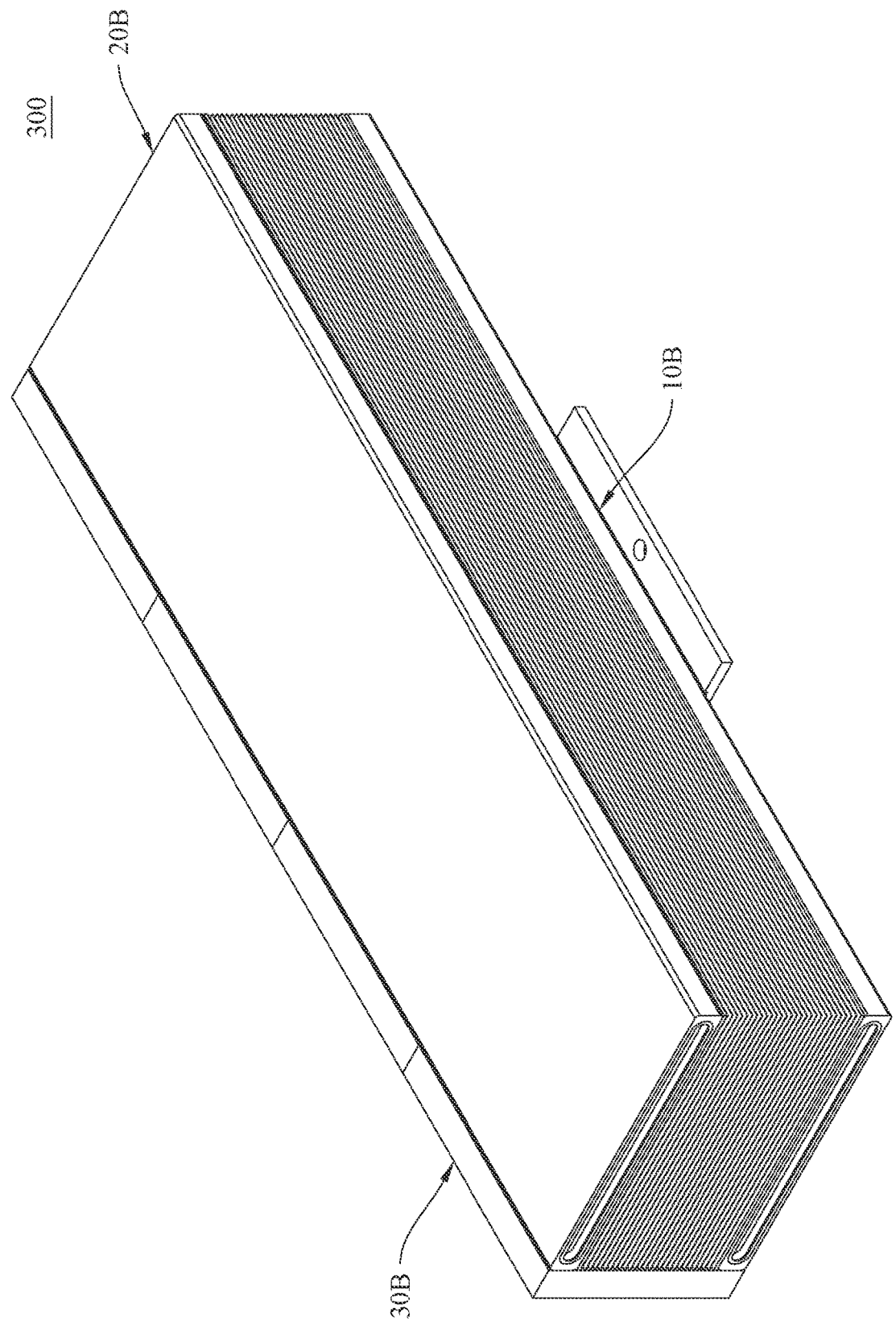
FIG. 7 is a perspective view of the second embodiment of the present invention.
Figure 8:
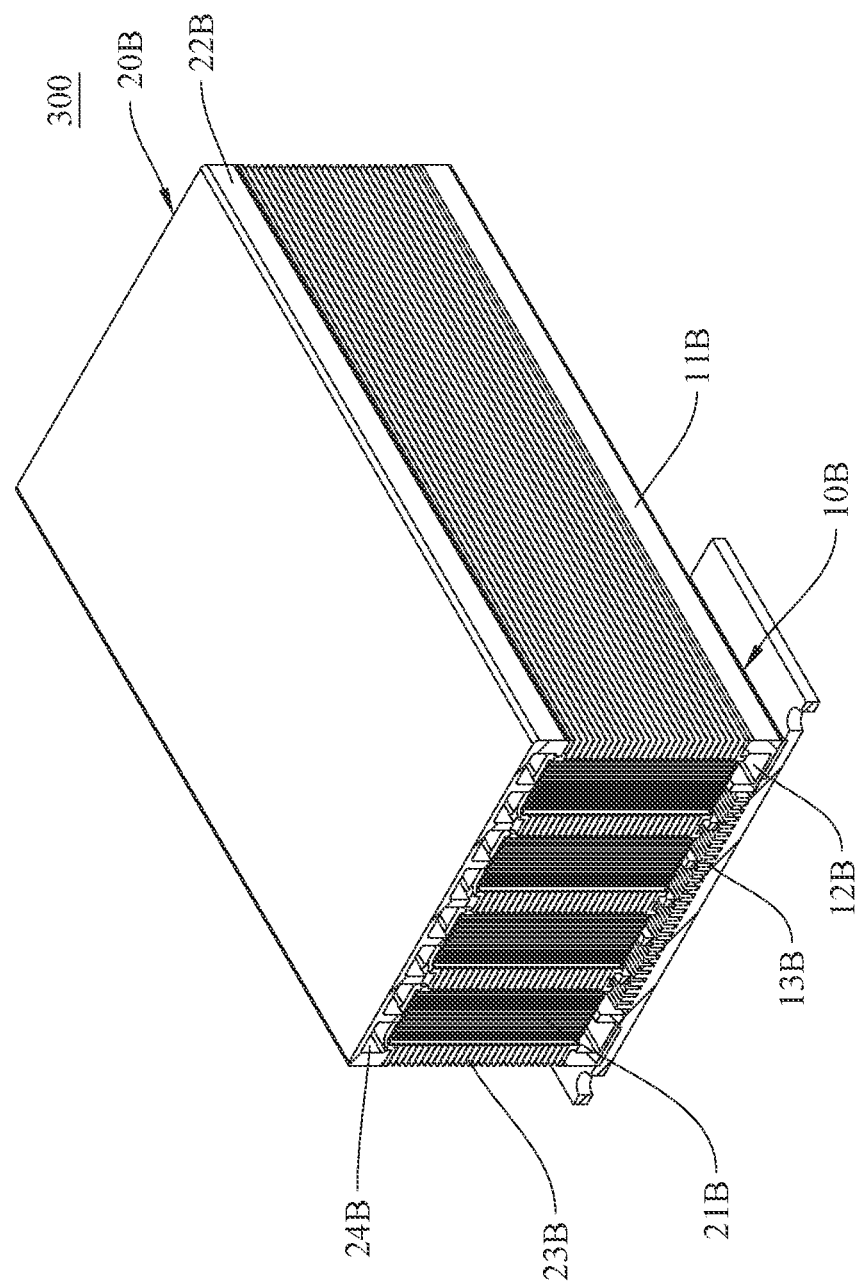
FIG. 8 is a partial sectional view of the second embodiment of the present invention.
Figure 9:
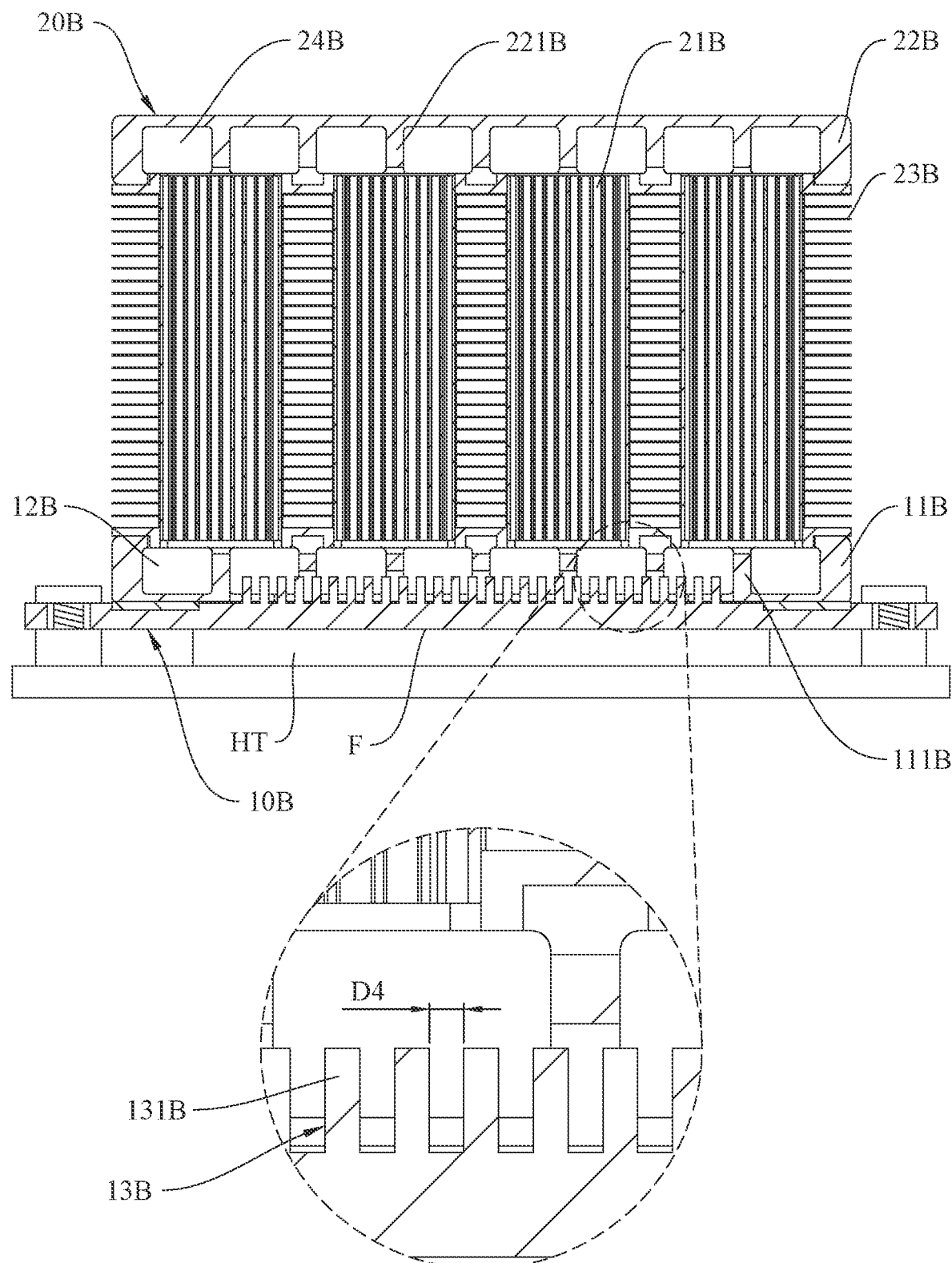
FIG. 9 is a sectional view and a partial enlarged view of the second embodiment of the present invention.

Another embodiment of the present invention is described below with reference to FIG. 7, FIG. 8, and FIG. 9, which show a perspective view, a partial sectional view, a sectional view, and a partial enlarged view of the second embodiment of the invention.

The stack-type vertical heat dissipation device 300 according to the second embodiment essentially includes an evaporator unit 10B, a condenser unit 20B coupled to the top side of the evaporator unit 10B, and a fan unit 30B provided on one side of the condenser unit 20B.

The evaporator unit 10B essentially includes a first housing 11B, an evaporation chamber 12B provided inside the first housing 11B, and a skived structure 13B provided in the evaporation chamber 12B. In one feasible embodiment, the first housing 11B may be made of aluminum, an aluminum alloy, or other similar materials; the present invention has no limitation in this regard. In one feasible embodiment, the first housing 11B of the evaporator unit 10B is provided with a plurality of reinforcing ribs 111B that extend into the evaporation chamber 12B to increase the structural strength, and thereby prevent deformation and bursting, of the evaporator unit 10B.

The skived structure 13B includes a plurality of skived plates 131B that are formed on the inner bottom side of the first housing 11B by skiving. In one feasible embodiment, the distance D4 between each two adjacent skived plates 131B may range from 0.1 mm to 0.5 mm, which numerical range can lead to highly efficient heat dissipation.

The condenser unit 20B is provided on the top side of the first housing 11B. The condenser unit 20B includes a plurality of flat tubes 21B that are coupled to the top side of the first housing 11B at one end, a second housing 22B provided at the top-side ends of the flat tubes 21B, and a plurality of heat dissipation fins 23B provided around the flat tubes 21B. The second housing 22B is provided therein with a condensation chamber 24B that is in communication with the evaporation chamber 12B through the flat tubes 21B. The heat conduction medium is introduced in an overfilling manner into the evaporation chamber 12B, the flat tubes 21B, and the condensation chamber 24B, the three of which are in communication with one another. In one feasible embodiment, the second housing 22B is also provided with a plurality of reinforcing ribs 221B that extend into the condensation chamber 24B to increase the structural strength, and thereby prevent deformation and bursting, of the condenser unit 20B.

The heat conduction medium should be so chosen that it has good thermodynamic properties and is chemically inert, safe, and environmentally friendly. Please note that the heat conduction medium is injected into the heat dissipation device 300 of the present invention in an overfilling manner. It follows that the boiling point of the heat conduction medium under the overfilling pressure should be slightly lower than the target temperature, and that the latent heat of vaporization of the heat conduction medium should be relatively high in order for the heat in the evaporation chamber 12B to be conducted to the flat tubes 21B above through a change in phase of the heat conduction medium and then dissipated via the heat dissipation fins 23B around the flat tubes 21B. In one preferred embodiment, the heat conduction medium may be a refrigerant or any other low-boiling-point liquid; the present invention has no limitation in this regard. In one embodiment, the heat dissipation fins 23B may be formed by rolling or be plate-based fins.

Figure 10:
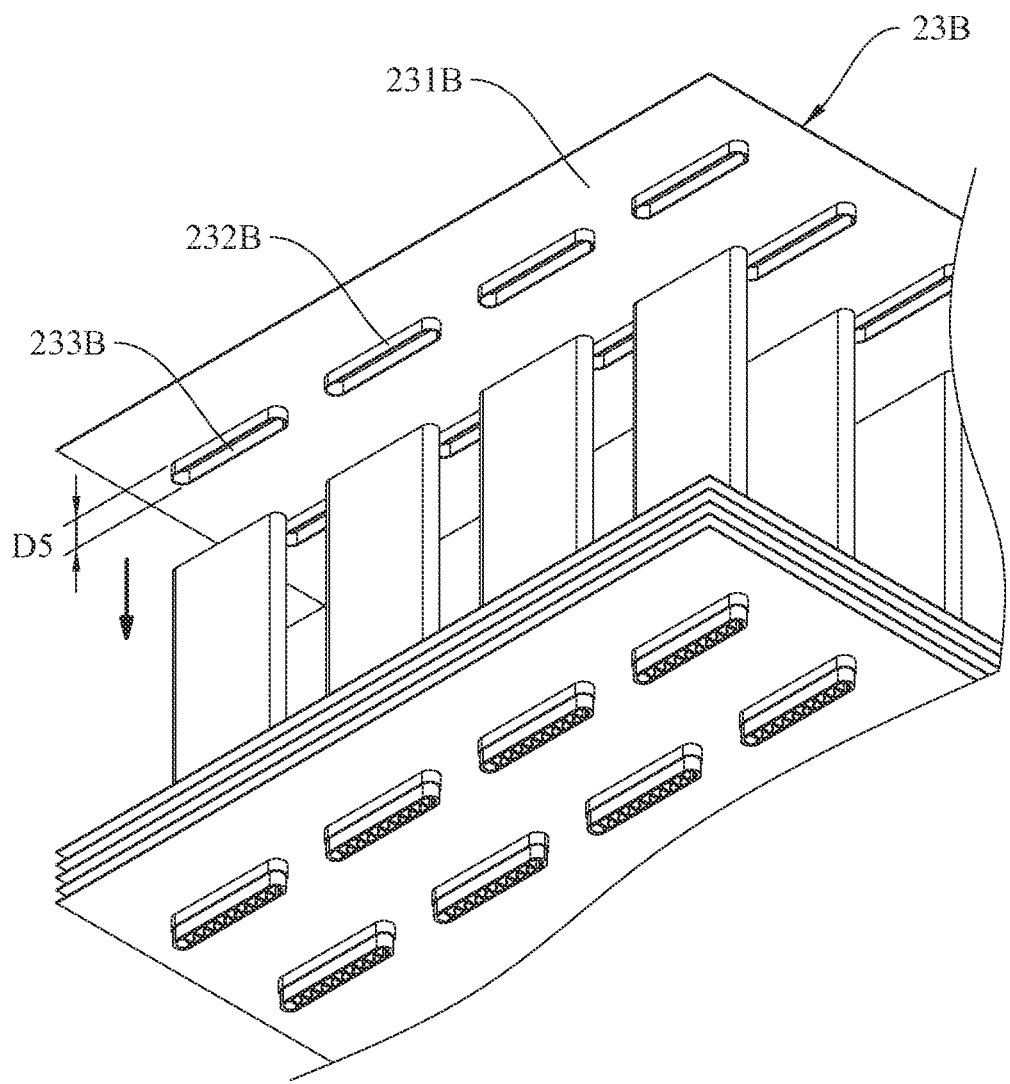
FIG. 10 is a perspective view of some heat dissipation fins in the second embodiment of the present invention.

In this embodiment, the heat dissipation fins 23B are plate-based fins to enlarge the area of contact with the flat tubes 21B and thereby enhance heat exchange efficiency. Referring to FIG. 10 for a perspective view of some heat dissipation fins in the second embodiment of the present invention, each plate-based fin (heat dissipation fin 23B) includes a plate-shaped body 231B and one or a plurality of connection portions 232B that are integrally formed with the plate-shaped body 231B to increase the height of the plate-shaped body 231B. Each connection portion 232B has a through hole 233B to be penetrated by the corresponding flat tube 21B, with the outer periphery of the corresponding flat tube 21B tightly enclosed by the wall of the through hole 233B. In one feasible embodiment, each connection portion 232B has a height D5 of 0.5 mm to 3 mm, which numerical range can lead to highly efficient heat dissipation. The heat dissipation efficiency of the heat dissipation fins 23B depends on the amount of air passing between them and the distance between each two adjacent fins. As a short spacing between the fins contributes to good thermal conduction but reduces the amount of air passing between the fins, a shorter spacing between the fins is not necessarily the better.

The bottom side of the first housing 11B has a heat-absorbing flat surface F attached to the high-temperature device HT. The heat-absorbing flat surface F is provided on the bottom side of the first housing 11B and corresponds to the opposite side of the skived structure 13B. This arrangement allows the heat of the heat source to be output to the center of the skived structure 13B in a concentrated manner and then radially diffused. The high-temperature device HT may be, for example, a processor, a chip, or other electronic components that tend to generate high heat; the present invention has no limitation in this regard.

Figure 11:
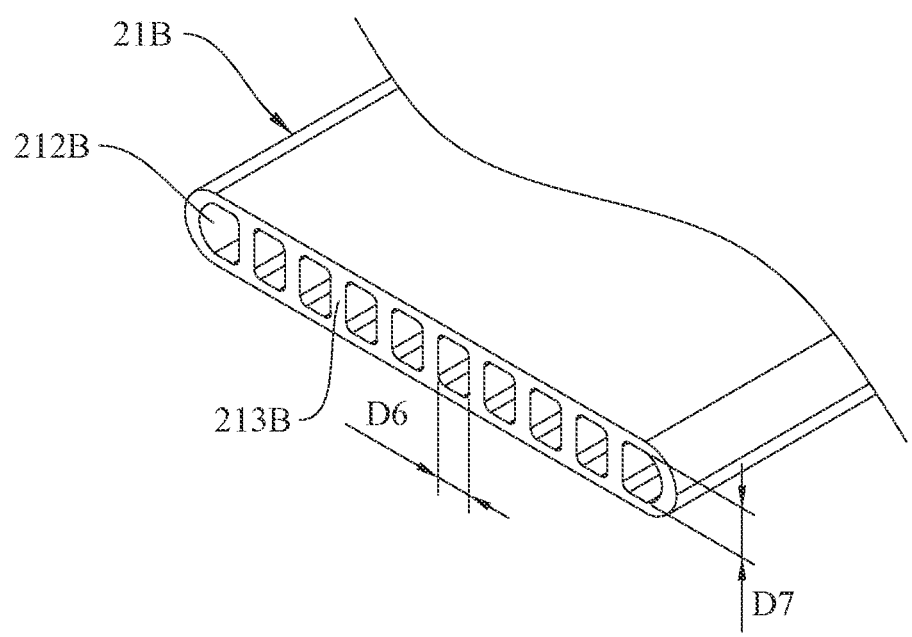
FIG. 11 is a partial enlarged view of a flat tube and the capillary tubes therein of the second embodiment of the present invention.

Please refer to FIG. 11 for a partial enlarged view of a flat tube, and the capillary tubes therein, in the second embodiment of the present invention.

In order to provide better heat dissipation and increase the mechanical stability of the flat tubes 21B against pressure, each flat tube 21B is provided therein, or more particularly is integrally formed therein, with a plurality of partition walls 213B that divide the interior of the flat tube 21B into a plurality of capillary tubes 212B. The partition walls 213B in each flat tube 21B help reinforce the central portions of the two flat sides of the flat tube 21B, thereby addressing the problem of insufficient pressure tolerance of those central portions and reducing the chance of tube bursting. In one feasible embodiment, the flat tubes 21B may be aluminum extruded tubes so that heat can be rapidly carried away by virtue of the structural design of the plural capillary tubes and the increased contact area provided by the capillary tubes. As the aluminum extrusion design allows the heat exchange area to be significantly enlarged, the uniformity of heat distribution as well as the amount of the heat carried away can be effectively increased, making it possible to distribute heat more evenly over the heat dissipation fins 23B so that heat can be rapidly diffused from a concentrated heat source (e.g., a chip) and then dissipated over a large area through the fan unit 30B. In one feasible embodiment, the width D6 of each capillary tube 212B is 0.5 mm to 2 mm, and the height D7 of each capillary tube 212B is 0.5 mm to 4 mm. Both pressure tolerance and heat dissipation efficiency should be considered when determining the width D6 and height D7 of the capillary tubes 212B; for example, overly small capillary tubes 212B will hinder circulation of the heat conduction medium.

To enhance convection and heat dissipation efficiency, a fan unit 30B is provided on one side of the stack-type vertical heat dissipation device 300 to encourage convection through the gaps between the heat dissipation fins 23B. In one embodiment in which the heat dissipation fins 23B are plate-based fins, the fan unit 30B is preferably provided on an opening side of the plate-based fins. The fan unit 30B may be an axial fan or a centrifugal fan without limitation.

Figure 12:
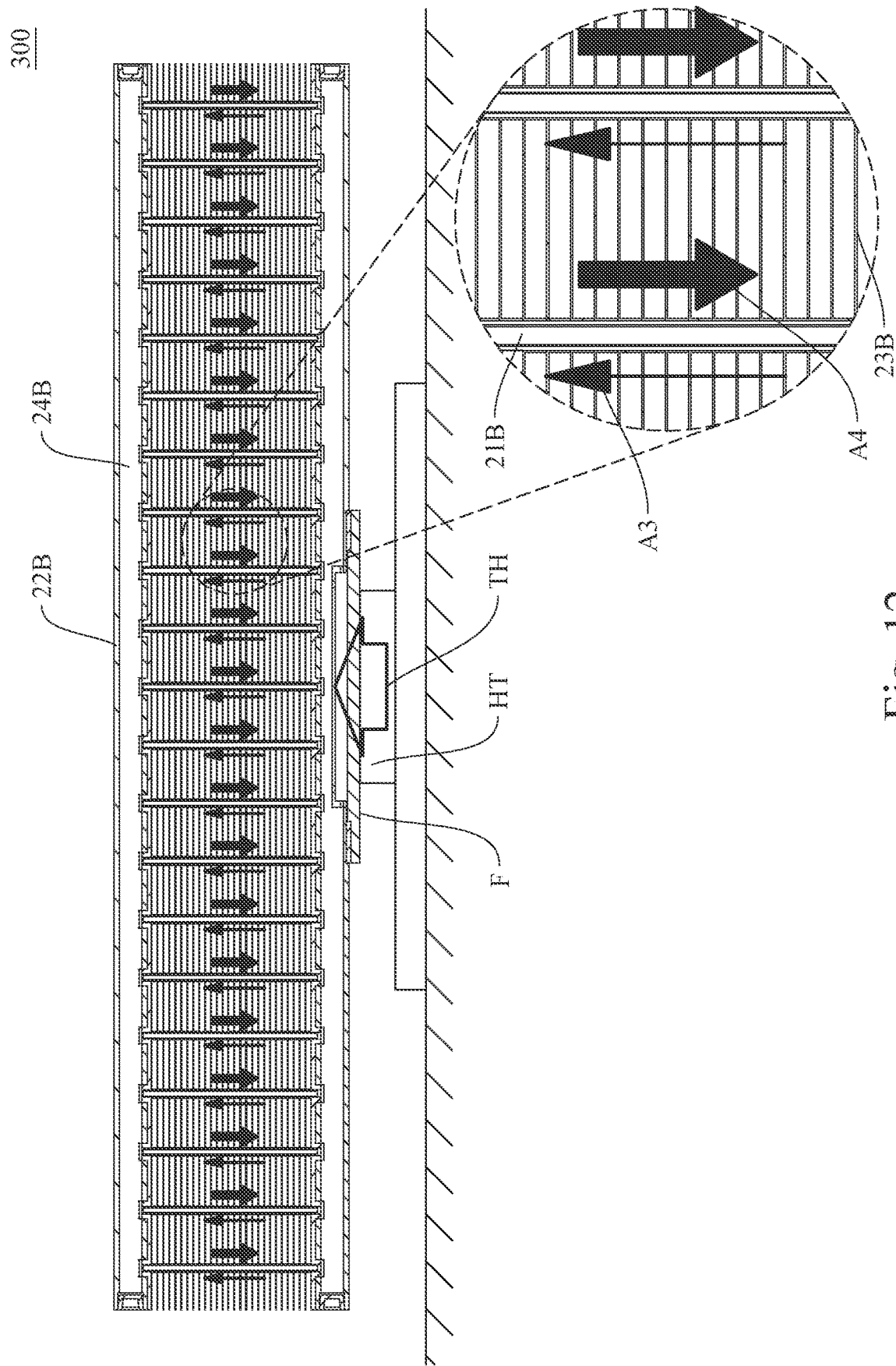
FIG. 12 is diagram of the heat conduction path of the second embodiment of the present invention.

As to the heat conduction path of the stack-type vertical heat dissipation device 300 of the present invention, please refer to FIG. 12 for the heat conduction path of the second embodiment of the invention.

The heat of the high-temperature device HT is diffused radially from under the first housing 11B to the skived structure 13B on the upper side (as indicated by the arrow TH), and the temperature of the skived structure 13B rises as a result. In the meantime, the heat conduction medium in which the skived structure 13B is immersed absorbs the heat of the skived structure 13B, undergoes a change in phase (i.e., is converted into the gaseous state), and ascends to the openings of the flat tubes 21B on the upper side (as indicated by the arrow A3). After that, the gaseous heat conduction medium is transferred through the openings into the capillary tubes 212B of the flat tubes 21B on the upper side, and then is transported via the flat tubes 21B up to the condensation chamber 24B inside the second housing 22B on the top side. The gaseous heat conduction medium conducts the heat to the flat tubes 21B and the wall surface of the condensation chamber 24B, and the heat on the tube walls was taken away through the convection of the heat dissipation fins 23B and the fan unit 30B. Finally, the gaseous heat conduction medium is cooled and condensed, and drops along the capillary tubes 212B (as indicated by the arrow A4) onto the skived structure 13B. The liquid heat conduction medium is reheated by the skived structure 13B and turns into the gaseous state again, thereby completing a thermal cycle, or a cycle of phase changes.

Figure 13:
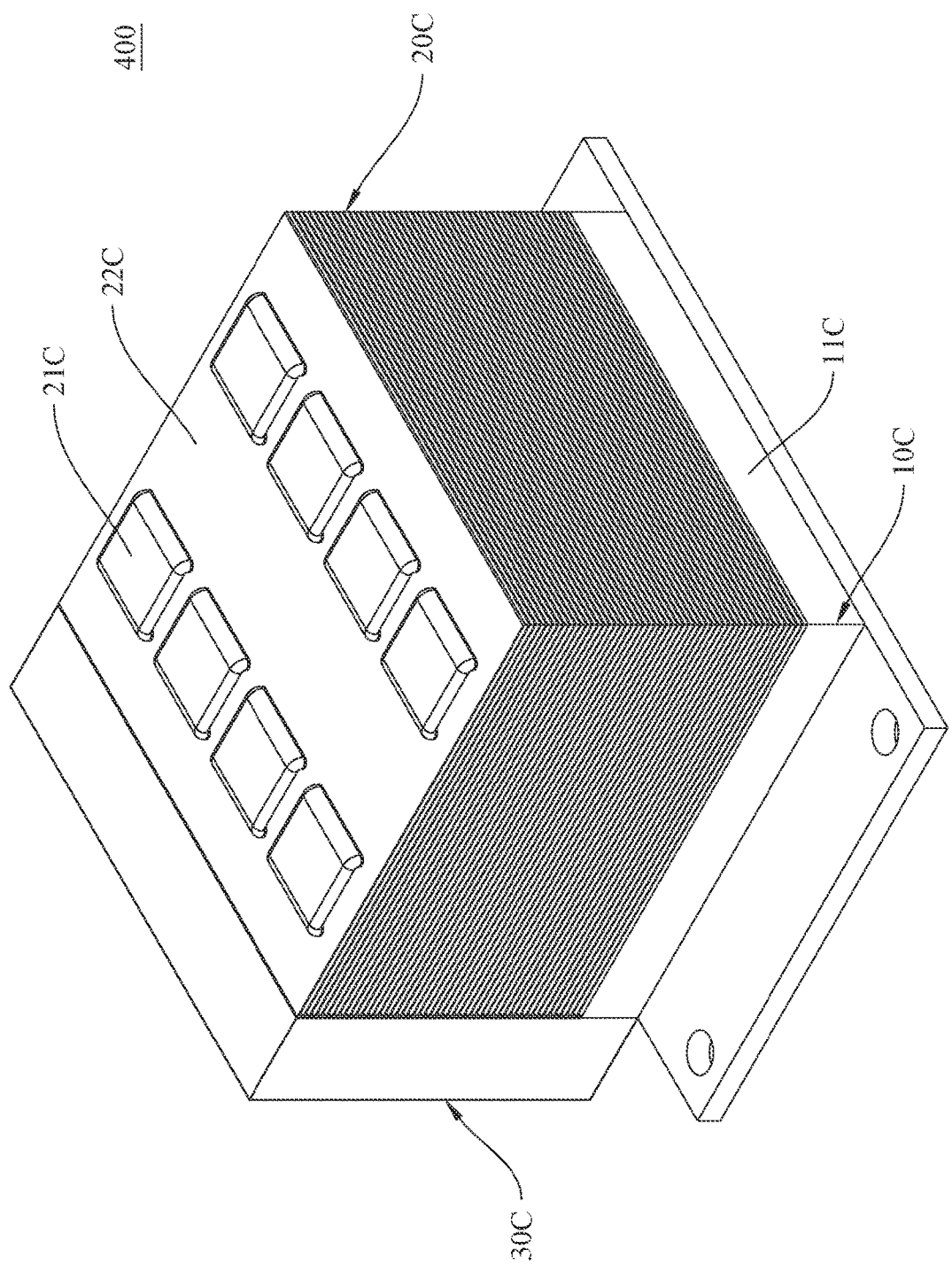
FIG. 13 is a perspective view of the third embodiment of the present invention.
Figure 14:
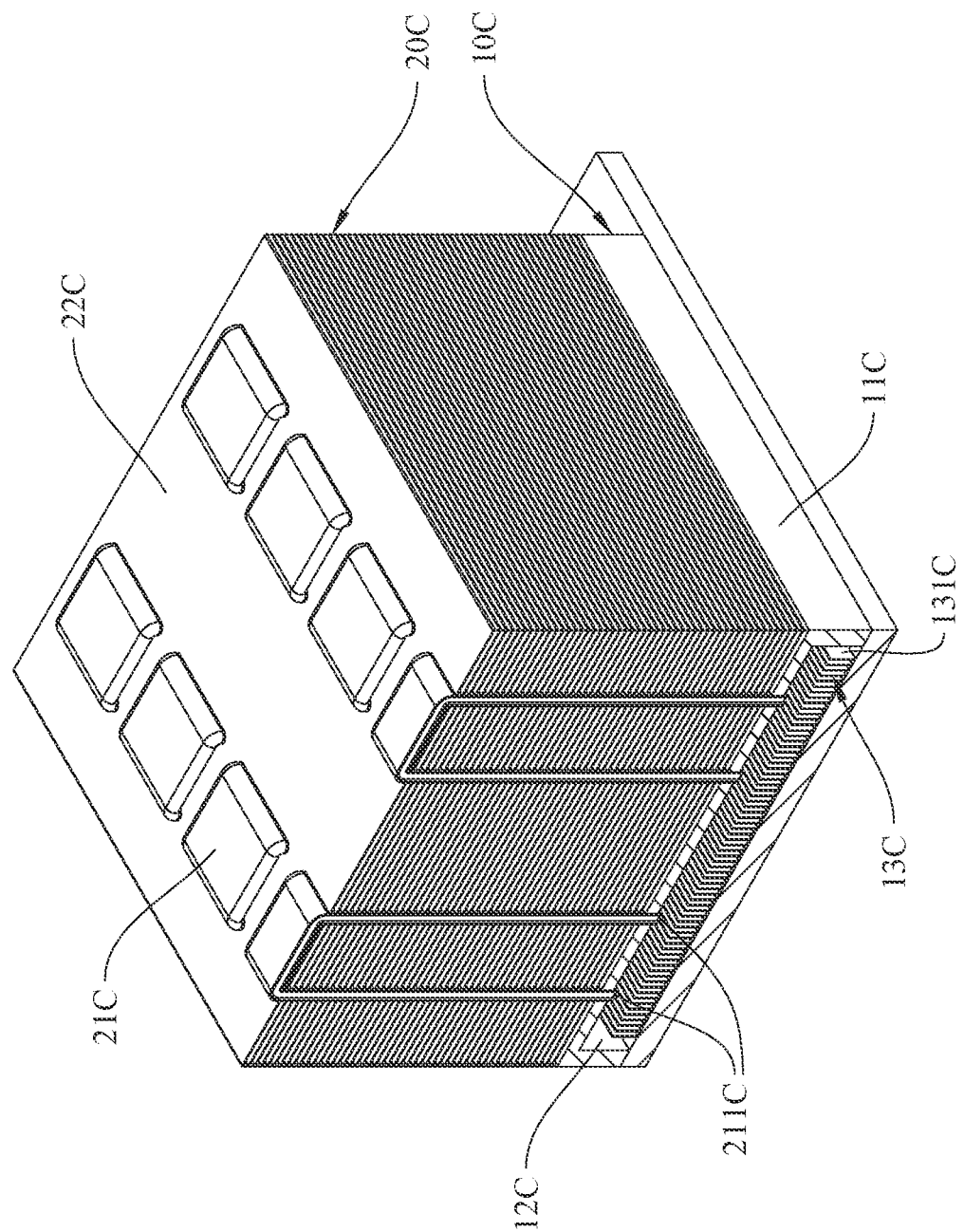
FIG. 14 is a sectional view of the third embodiment of the present invention.
Figure 15:
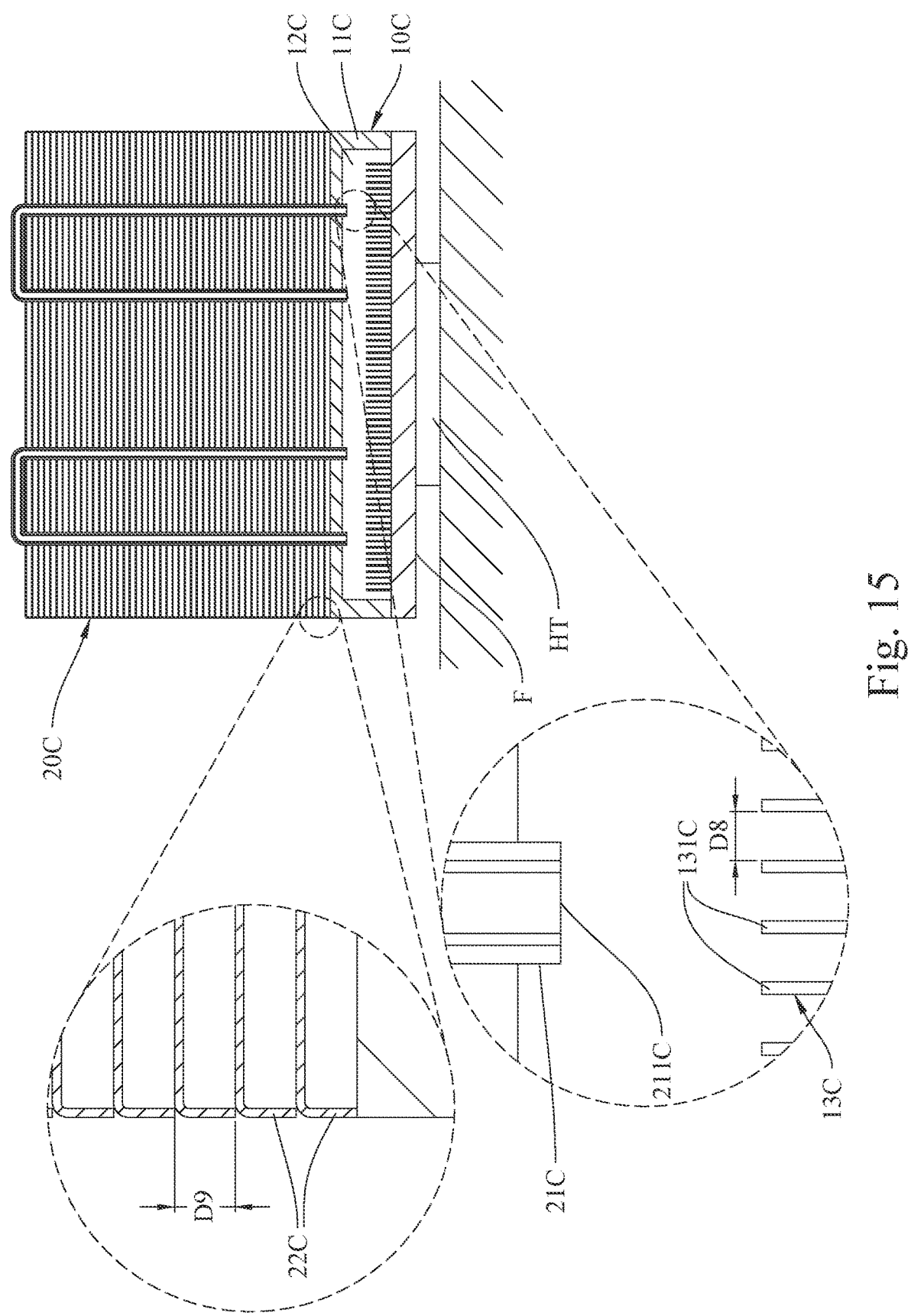
FIG. 15 is a sectional view and some partial enlarged views of the third embodiment of the present invention.

Yet another embodiment of the present invention is described below with reference to FIG. 13, FIG. 14, and FIG. 15, which show a perspective view, a partial sectional view, a sectional view, and some partial enlarged views of the third embodiment of the invention.

The stack-type vertical heat dissipation device 400 according to the third embodiment essentially includes an evaporator unit 10C, a condenser unit 20C coupled to the top side of the evaporator unit 10C, and a fan unit 30C provided on one side of the condenser unit 20C.

The evaporator unit 10C essentially includes a housing 11C, an evaporation chamber 12C provided inside the housing 11C, and a skived structure 13C provided in the evaporation chamber 12C. In one preferred embodiment, the housing 11C may be made of aluminum, an aluminum alloy, or other similar materials; the present invention has no limitation in this regard.

The skived structure 13C includes a plurality of skived plates 131C that are formed on the inner bottom side of the housing 11C by skiving. In one feasible embodiment, the distance D8 between each two adjacent skived plates 131C may range from 0.1 mm to 0.5 mm, which numerical range can lead to highly efficient heat dissipation.

The condenser unit 20C is provided on the top side of the housing 11C. The condenser unit 20C includes a plurality of flat tubes 21C that are coupled to the top side of the housing 11C and a plurality of heat dissipation fins 22C that are stacked on the housing 11C and provided around the flat tubes 21C. Each flat tube 21C is U-shaped, i.e., bent through 180 degrees, such that the openings 211C on two opposite lateral sides of the flat tube 21C face the same direction, i.e., downward. The openings 211C on two opposite lateral sides of each flat tube 21C are connected to the top side of the housing 11C, are in communication with the evaporation chamber 12C inside the housing 11C, and correspond to a position above the skived structure 13C. The heat conduction medium is introduced in an overfilling manner into the evaporation chamber 12C and the flat tubes 21C, the two of which (including the evaporation chamber 12C and the capillary tubes 212C in the flat tubes 21C) are in communication with each another.

The heat conduction medium should be so chosen that it has good thermodynamic properties and is chemically inert, safe, and environmentally friendly. Please note that the heat conduction medium is injected into the heat dissipation device 400 of the present invention in an overfilling manner. It follows that the boiling point of the heat conduction medium under the overfilling pressure should be slightly lower than the target temperature, and that the latent heat of vaporization of the heat conduction medium should be relatively high in order for the heat in the evaporation chamber 12C to be conducted to the flat tubes 21C above through a change in phase of the heat conduction medium and then dissipated via the heat dissipation fins 22C around the flat tubes 21C. In one preferred embodiment, the heat conduction medium may be a refrigerant or a low-boiling-point liquid; the present invention has no limitation in this regard.

In one feasible embodiment, each heat dissipation fin 22C has an inverted square U-shaped cross section, and the heat dissipation fins 22C are sequentially fastened together, with the tail end of one fin locked to the head end of the next. These inverted square U-shaped and sequentially fastened fins help increase the mechanical stability, and hence the overall rigidity, of the stack-type vertical heat dissipation device 400. In one feasible embodiment, the distance D9 between each two adjacent ones of the inverted square U-shaped and sequentially fastened fins is 0.5 mm to 3 mm, which numerical range can lead to highly efficient heat dissipation. The heat dissipation efficiency of the heat dissipation fins 22C depends on the amount of air passing between them and the distance between each two adjacent fins. As a short spacing between the fins contributes to good thermal conduction but reduces the amount of air passing between the fins, a shorter spacing between the fins is not necessarily the better.

The bottom side of the housing 11C has a heat-absorbing flat surface F attached to the high-temperature device HT. The heat-absorbing flat surface F is provided on the bottom side of the housing 11C and corresponds to the opposite side of the skived structure 13C. This arrangement allows the heat of the heat source to be output to the center of the skived structure 13C in a concentrated manner and then radially diffused. The high-temperature device HT may be, for example, a processor, a chip, or other electronic components that tend to generate high heat; the present invention has no limitation in this regard.

Figure 16:
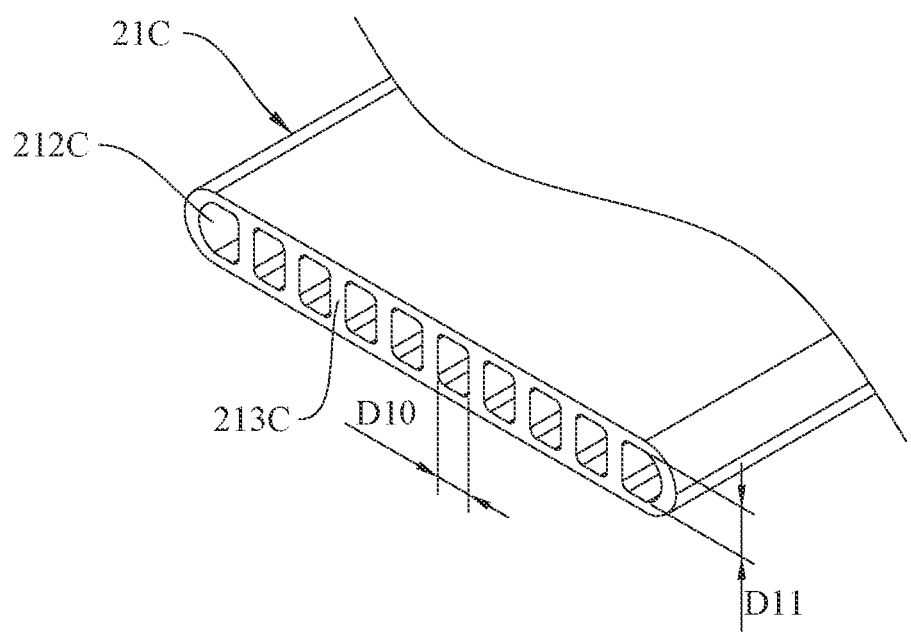
FIG. 16 is a partial enlarged view of a flat tube, and the capillary tubes therein, in the third embodiment of the present invention.

Please refer to FIG. 16 for a partial enlarged view of a flat tube, and the capillary tubes therein, in the third embodiment of the present invention.

In order to provide better heat dissipation and increase the mechanical stability of the flat tubes 21C against pressure, each flat tube 21C is provided therein, or more particularly is integrally formed therein, with a plurality of partition walls 213C that divide the interior of the flat tube 21C into a plurality of capillary tubes 212C. The partition walls 213C in each flat tube 21C help reinforce the central portions of the two flat sides of the flat tube 21C, thereby addressing the problem of insufficient pressure tolerance of those central portions and reducing the chance of tube bursting. In one feasible embodiment, the flat tubes 21C may be aluminum extruded tubes so that heat can be rapidly carried away by virtue of the structural design of the plural capillary tubes and the increased contact area provided by the capillary tubes. As the aluminum extrusion design allows the heat exchange area to be significantly enlarged, the uniformity of heat distribution as well as the amount of the heat carried away can be effectively increased, making it possible to distribute heat more evenly over the heat dissipation fins 22C so that heat can be rapidly diffused from a concentrated heat source (e.g., a chip) and then dissipated over a large area through the fan unit 30C. In one feasible embodiment, the width D10 of each capillary tube 212C is 0.5 mm to 2 mm, and the height D11 of each capillary tube 212C is 0.5 mm to 4 mm. Both pressure tolerance and heat dissipation efficiency should be considered when determining the width D10 and height D11 of the capillary tubes 212C; for example, overly small capillary tubes 212C will hinder circulation of the heat conduction medium.

Figure 17:
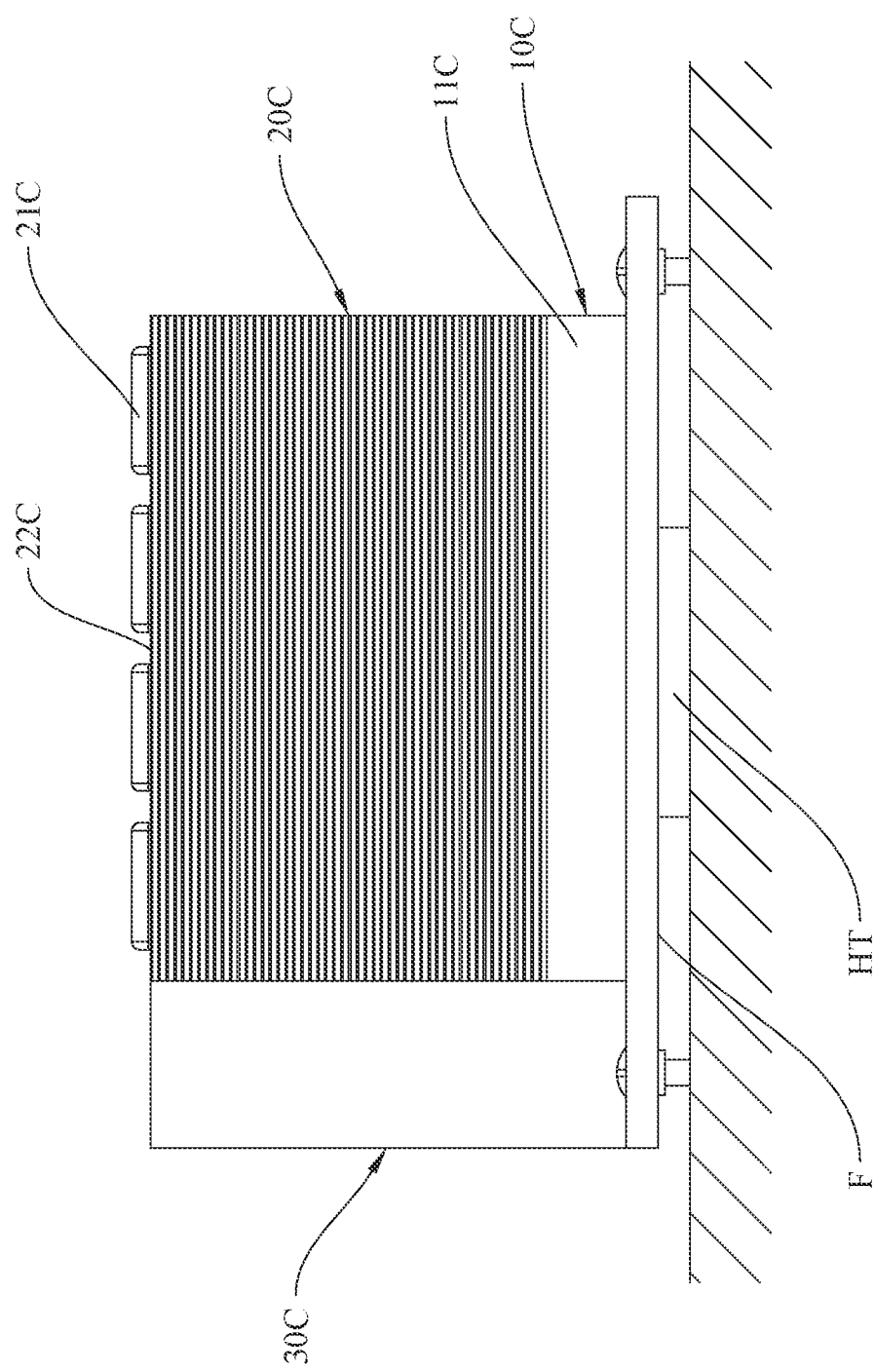
FIG. 17 is a side view of the third embodiment of the present invention.

Please refer to FIG. 17 for a side view of the third embodiment of the present invention.

To enhance convection and heat dissipation efficiency, a fan unit 30C is provided on one side of the stack-type vertical heat dissipation device 400 to encourage convection through the gaps between the heat dissipation fins 22C. In one embodiment in which the heat dissipation fins 22C are the aforesaid inverted square U-shaped and sequentially fastened fins, the fan unit 30C is preferably provided on an opening side of the inverted square U-shaped and sequentially fastened fins. The fan unit 30C may be an axial fan or a centrifugal fan without limitation.

Figure 18:
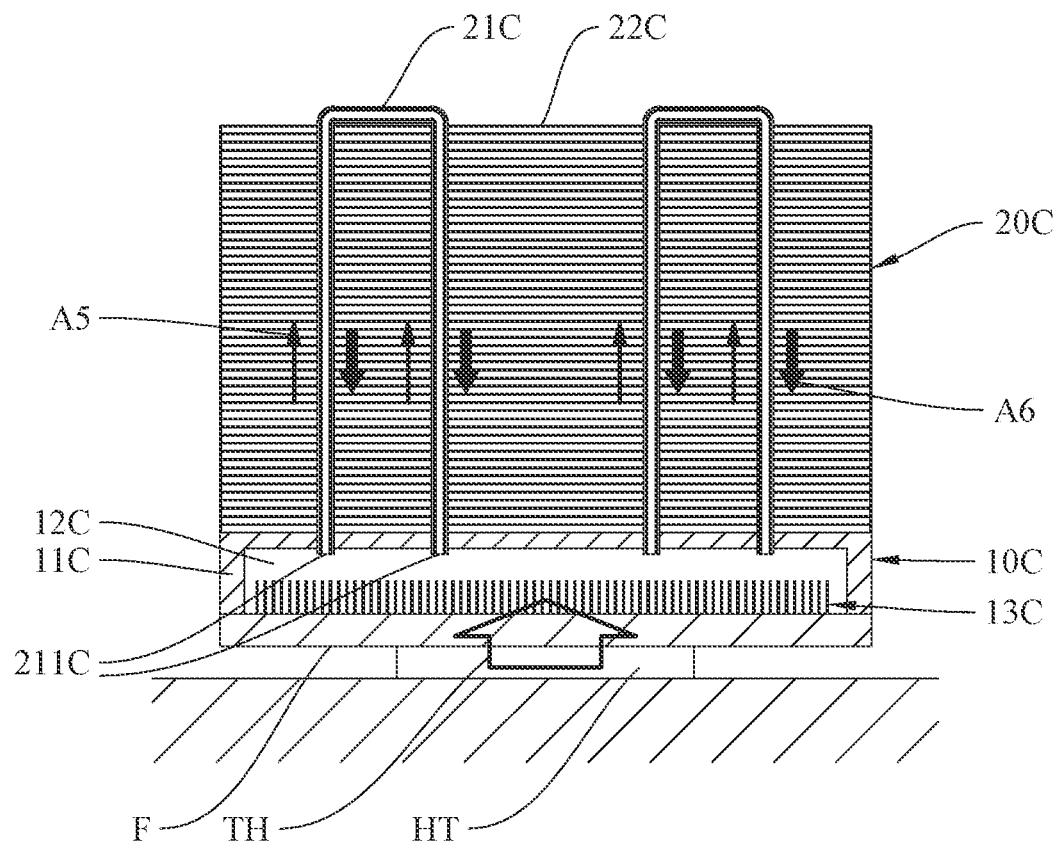
FIG. 18 is a diagram of the heat conduction path of the third embodiment of the present invention.

As to the heat conduction path of the stack-type vertical heat dissipation device 400 of the present invention, please refer to FIG. 18 for the heat conduction path of the third embodiment of the invention.

The heat of the high-temperature device HT is diffused radially from under the housing 11C to the skived structure 13C on the upper side (as indicated by the arrow TH), and the temperature of the skived structure 13C rises as a result.

In the meantime, the heat conduction medium in which the skived structure 13C is immersed absorbs the heat of the skived structure 13C, undergoes a change in phase (i.e., is converted into the gaseous state), and ascends to the openings 211C of the flat tubes 21C on the upper side (as indicated by the arrow A5). After that, the gaseous heat conduction medium is transferred through the openings 211C into the capillary tubes 212C of the flat tubes 21C on the upper side. The gaseous heat conduction medium conducts the heat to the wall surfaces of the flat tubes 21C, and the heat on the tube walls was taken away through the convection of the heat dissipation fins 22C and the fan unit 30C. Finally, the gaseous heat conduction medium is cooled and condensed, and drops along the capillary tubes 212C (as indicated by the arrow A6) onto the skived structure 13C. The liquid heat conduction medium is reheated by the skived structure 13C and turns into the gaseous state again, thereby completing a thermal cycle, or a cycle of phase changes.

According to the above, the present invention provides higher heat dissipation efficiency than the prior art and allows the end product to be effectively downsized for higher practicality. In addition, the structure of the invention can effectively withstand the pressure generated by being overfilled with a heat conduction medium, so the safety and service life of the end product are increased in comparison with those of the prior art. Moreover, by way of vertical stacking, the invention effectively enhances the circulation efficiency of the heat conduction medium and thereby reduces clogging when the heat conduction medium cools down.

The above is the detailed description of the present invention. However, the above is merely the preferred embodiment of the invention and cannot be the limitation to the implement scope of the invention, which means the variation and modification according to the invention may still fall into the scope of the invention.

What is claimed is:

1. A stack-type vertical heat dissipation device, comprising: an evaporator unit having a side configured for direct or indirect contact with, and thereby receiving heat from, a high-temperature device in order for the heat to convert a heat conduction medium inside the evaporator unit into a gaseous state; and a condenser unit stacked on a top side of the evaporator unit, the condenser unit being provided therein with a flow channel, the flow channel being in communication with the evaporator unit and allowing passage of the heat conduction medium so that the heat conduction medium is able to return to the evaporator unit under a force of gravity after condensing from the gaseous state into a liquid state and thereby complete a thermal cycle; wherein the condenser unit comprises an upper main duct, a lower main duct, a plurality of flat tubes each having two opposite ends coupled to and communicating with the upper main duct and the lower main duct respectively, at least one main gas-flow passage tube that is coupled between and in communication with the upper main duct and the evaporation chamber, and a plurality of heat dissipation fins are provided around the flat tubes; wherein the evaporator unit includes a housing, an evaporation chamber provided inside the housing, and a skived structure provided in the evaporation chamber; wherein the main gas-flow passage tube has a lower-end opening, the lower-end opening of the main gas-flow passage tube is directly aligned above the skived structure, a main body extending through a middle portion of the lower main duct, and an upper-end opening of the main gas-flow passage tube is directly aligned above the lower-end opening of the main gas-flow passage tube and in communication with the upper main duct; wherein the main gas flow passage tube is vertical and goes straight in between the lower main duct and the upper main duct, the heat dissipation fins respectively are disposed on two opposite lateral sides of the main gas-flow passage tube, and the lower-end opening of the main gas-flow passage tube overlaps with the skived plates through a top view direction; wherein the skived structure includes a plurality of skived plates that are formed on the inner bottom side of the housing by skiving, a distance between each two adjacent skived plates ranges from 0.1 mm to 0.5 mm; and wherein a plurality of drainage tubes are provided between the lower main duct and the evaporator unit, each drainage tube of the plurality of drainage tubes has an upper-end opening in communication with an inner bottom side of the lower main duct and a lower-end opening in communication with an internal chamber of the evaporator unit, and the upper-end opening and the lower-end opening of each drainage tube of the plurality of drainage tubes are directly aligned such that the upper-end opening is above the lower-end opening, wherein the main gas-flow passage tube is located between the plurality of drainage tubes.

2. The stack-type vertical heat dissipation device of claim 1, wherein each flat tube is integrally formed therein with a plurality of partition walls that divide an interior of the flat tube into a plurality of capillary tubes.

3. The stack-type vertical heat dissipation device of claim 2, wherein each capillary tube has a width of 0.5 mm to 2 mm and a height of 0.5 mm to 4 mm.

4. The stack-type vertical heat dissipation device of claim 1, wherein a single-array configuration comprises the upper main duct in an amount of one, the lower main duct in an amounts of one, and the main gas-flow passage tube in an amounts of one, and a number of the single-array configuration is one to four.

5. The stack-type vertical heat dissipation device of claim 4, wherein the number of the single-array configuration is two.

6. The stack-type vertical heat dissipation device of claim 5, wherein the upper main ducts of the two single-array configurations are adjacent, wherein a reinforcing connection plate is provided between the upper main ducts, the reinforcing connection plate has one or more communication holes, and each communication hole is in communication with the upper main ducts at two opposite ends of the communication hole.

7. The stack-type vertical heat dissipation device of claim 5, wherein the lower main ducts of the two single-array configurations are adjacent, wherein a reinforcing connection plate is provided between the lower main ducts, the reinforcing connection plate has one or more communication holes, and each communication hole is in communication with the lower main ducts at two opposite ends of the communication hole.

* * * * *